United States Patent
Cho et al.

(10) Patent No.: US 6,926,926 B2
(45) Date of Patent: Aug. 9, 2005

(54) SILICON CARBIDE DEPOSITED BY HIGH DENSITY PLASMA CHEMICAL-VAPOR DEPOSITION WITH BIAS

(75) Inventors: Seon-Mee Cho, Santa Clara, CA (US); Hichem M'Saad, Santa Clara, CA (US); Farhad Moghadam, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 649 days.

(21) Appl. No.: 09/953,685

(22) Filed: Sep. 10, 2001

(65) Prior Publication Data

US 2003/0049388 A1 Mar. 13, 2003

(51) Int. Cl.$^7$ ............................................. C23C 16/30
(52) U.S. Cl. ................. 427/249.15; 118/715; 118/728; 427/577; 427/578; 438/778
(58) Field of Search .................... 118/715, 728; 427/577, 578, 249.15, 99; 438/778

(56) References Cited

U.S. PATENT DOCUMENTS

| | | | |
|---|---|---|---|
| 4,555,464 A | 11/1985 | Kido et al. | 430/67 |
| 4,557,946 A | 12/1985 | Sacher et al. | 427/41 |
| 4,789,648 A | 12/1988 | Chow et al. | 437/225 |
| 4,798,629 A | 1/1989 | Wood et al. | 106/287.16 |
| 4,812,325 A | 3/1989 | Ishihara et al. | 427/69 |
| 4,828,880 A | 5/1989 | Jenkins et al. | 427/167 |
| 4,845,054 A | 7/1989 | Mitchener | 437/238 |
| 4,894,352 A | 1/1990 | Lane et al. | 437/238 |
| 4,900,591 A | 2/1990 | Bennett et al. | 427/255 |
| 4,973,511 A | 11/1990 | Farmer et al. | 428/216 |
| 4,981,724 A | 1/1991 | Hochberg et al. | 427/255 |
| 5,028,566 A | 7/1991 | Lagendijk | 437/238 |
| 5,040,046 A | 8/1991 | Chhabra et al. | 357/54 |
| 5,120,680 A | 6/1992 | Foo et al. | 437/238 |

(Continued)

FOREIGN PATENT DOCUMENTS

| | | |
|---|---|---|
| DE | 1965473 A1 | 7/1997 |
| EP | 0469926 A1 | 2/1991 |
| EP | 0519079 A1 | 12/1992 |

(Continued)

OTHER PUBLICATIONS

C.D. Dobson, A. Kiermasz, K. Beekman, R.J. Wilby, "Advanced $SiO_2$ Planarization Using Silane and $H_2O_2$" Dec. 1994, pp. 85–87.

(Continued)

*Primary Examiner*—Timothy Meeks
*Assistant Examiner*—William Phillip Fletcher, III
(74) *Attorney, Agent, or Firm*—Townsend and Townsend and Crew

(57) ABSTRACT

A SiC-based layer is deposited on a substrate having an electrical resistivity between about 1 and 100 Ω cm. The substrate is disposed in a process chamber. A gaseous mixture having a silicon-containing gas and a hydrocarbon-containing gas is flowed to the process chamber. A high-density plasma, having an ion density greater than about $10^{11}$ ions/cm$^3$ is generated from the plasma. A small electrical bias, between about 0.65 and 1.30 W/cm$^2$, is applied to the substrate. The low bias compensates for an unexpected cooling that results when depositing the SiC-based layer but is low enough that implantation of hydrogen is minimized.

18 Claims, 14 Drawing Sheets

U.S. PATENT DOCUMENTS

| | | | |
|---|---|---|---|
| 5,124,014 A | 6/1992 | Foo et al. | 204/192.32 |
| 5,204,141 A | 4/1993 | Roberts et al. | 427/255.3 |
| 5,224,441 A | 7/1993 | Felts et al. | 118/718 |
| 5,246,887 A | 9/1993 | Yu | 437/238 |
| 5,249,867 A | 10/1993 | Iida | 427/583 |
| 5,250,473 A | 10/1993 | Smits | 437/238 |
| 5,314,724 A | 5/1994 | Tsukune et al. | 427/489 |
| 5,352,493 A | 10/1994 | Dorfman et al. | 427/530 |
| 5,362,526 A | 11/1994 | Wang et al. | 437/235 |
| 5,364,666 A | 11/1994 | Williams et al. | 427/579 |
| 5,465,680 A | 11/1995 | Loboda | 117/84 |
| 5,466,431 A | 11/1995 | Dorfman et al. | 423/446 |
| 5,468,520 A | 11/1995 | Williams et al. | 427/560 |
| 5,494,712 A | 2/1996 | Hu et al. | 427/489 |
| 5,508,368 A | 4/1996 | Knapp et al. | 427/534 |
| 5,554,570 A | 9/1996 | Maeda et al. | 437/235 |
| 5,563,105 A | 10/1996 | Dobuzinsky et al. | 437/240 |
| 5,578,523 A | 11/1996 | Fiordalice et al. | 437/190 |
| 5,593,741 A | 1/1997 | Ikeda | 427/579 |
| 5,598,027 A | 1/1997 | Matsuura | 257/635 |
| 5,616,369 A | 4/1997 | Williams et al. | 427/536 |
| 5,618,619 A | 4/1997 | Petrmichl et al. | 428/334 |
| 5,637,351 A | 6/1997 | O'Neal et al. | 427/255.3 |
| 5,638,251 A | 6/1997 | Goel et al. | 361/313 |
| 5,661,093 A | 8/1997 | Ravi et al. | 438/763 |
| 5,683,940 A | 11/1997 | Yahiro | 437/195 |
| 5,693,563 A | 12/1997 | Teong | 437/190 |
| 5,700,720 A | 12/1997 | Hashimoto | 437/195 |
| 5,703,404 A | 12/1997 | Matsuura | 257/758 |
| 5,739,579 A | 4/1998 | Chiang et al. | 257/635 |
| 5,750,210 A | 5/1998 | Schmidt et al. | 430/67 |
| 5,753,564 A | 5/1998 | Fukada | 437/238 |
| 5,789,319 A | 8/1998 | Havemann et al. | 438/668 |
| 5,800,878 A | 9/1998 | Yao | 427/573 |
| 5,807,785 A | 9/1998 | Ravi | 438/624 |
| 5,821,168 A | 10/1998 | Jain | 438/692 |
| 5,834,162 A | 11/1998 | Malba | 430/317 |
| 5,858,880 A | 1/1999 | Dobson et al. | 438/758 |
| 5,888,593 A | 3/1999 | Petrmichl et al. | 427/563 |
| 5,891,799 A | 4/1999 | Tsui | 438/624 |
| 6,001,267 A * | 12/1999 | Os et al. | 216/67 |
| 6,051,321 A | 4/2000 | Lee et al. | 427/447 |
| 6,142,612 A * | 11/2000 | Whitman | 347/63 |
| 6,251,770 B1 | 6/2001 | Uglow et al. | 438/624 |
| 6,444,568 B1 * | 9/2002 | Sundararajan et al. | 438/627 |
| 6,559,042 B2 * | 5/2003 | Barth et al. | 438/601 |

FOREIGN PATENT DOCUMENTS

| | | | | |
|---|---|---|---|---|
| EP | 0522799 A2 | 1/1993 | | |
| EP | WO94/01885 | 1/1994 | | |
| EP | 0725440 | 1/1996 | | |
| EP | 0711817 A2 | 5/1996 | | |
| EP | 0721019 A2 | 7/1996 | | |
| EP | 0721019 A3 | 7/1996 | | |
| EP | 0743675 A1 | 11/1996 | | |
| EP | 0774533 A1 | 5/1997 | | |
| EP | 0885983 A1 | 12/1998 | | |
| JP | SHO59-98726 | 6/1984 | | |
| JP | 60111480 | 6/1985 | | |
| JP | 01050429 | 2/1989 | | |
| JP | WO92/12535 | 7/1992 | | |
| JP | 05267480 | 10/1993 | | |
| JP | 6-163521 | 6/1994 | | |
| JP | 6-168937 | 6/1994 | | |
| JP | 8-222559 | 8/1996 | | |
| JP | 8-236518 | 9/1996 | | |
| JP | 8-288286 | 11/1996 | | |
| JP | 8-8031 | 1/1997 | | |
| JP | 09228055 A * | 9/1997 | | C23C/16/50 |
| JP | 9-237785 | 9/1997 | | |
| JP | 2000286252 A * | 10/2000 | | H01L/21/314 |
| WO | WO98/08249 | 2/1998 | | |
| WO | WO98/59089 | 12/1998 | | |
| WO | WO99/33102 | 1/1999 | | |

OTHER PUBLICATIONS

C.Y. Chang and S.M. Sze, ULSI Technology, 1996, McGraw–Hill, pp. 444–445.

L.C. Feldman, Murray Hill, and W.F. van der Weg, "applied surface science," vol. 43 (1989), pp. 301–303.

"Journal of Vacuum Science & Technology A Vacuum, Surfaces, and Films," J.Vac. Sci. Technol. A, vol. 13, No. 2, Mar./Apr. 1995, pp. 475–480.

M. Matsuura, Y. Hayashide, H. Kotani, T. Nishimura, H. Iuchi, C.D. Dobson, A Kiermasz, K. Beekmann and R. Wilby, "Novel Sel–planarizing CVD Oxide for Interlayer Dielectric Applications," 1994, pp. 5.7.1–5.7.4.

Xu et al., "BLOK—A Low–K Dielectric Barrier/Etch Stop Film for Copper Damascene Applications," IITC 99–109, 1999 IEEE.

Laboda et al., "Plasma–enhanced chemical vapor deposition of a SIC:H films from organosilicon precursors," 8257A Journal of Vacuum Science & Technology, Jan./Feb. 1994, pp. 90–96.

Giorgis et al., "a SiC:H films deposited by PECVD from silane+acetylene and silane+acetylene+hydrogen gas mixture," Elsevier, Diamond and Related Materials 6 (1997) pp. 1606–1611.

Frédéric Gaillard, Pascal Brault, and Pierre Brouquet "Silicon dioxide chemical vapor deposition using silane and hydrogen peroxide," J. Vac. Sci. Technol. Jul./Aug. 1995, pp. 2767–2769.

* cited by examiner

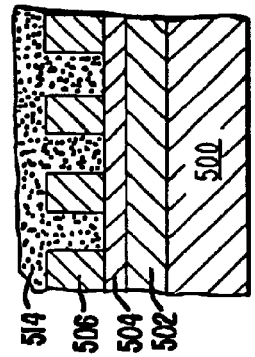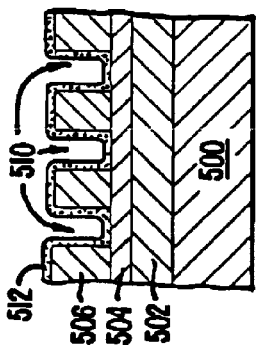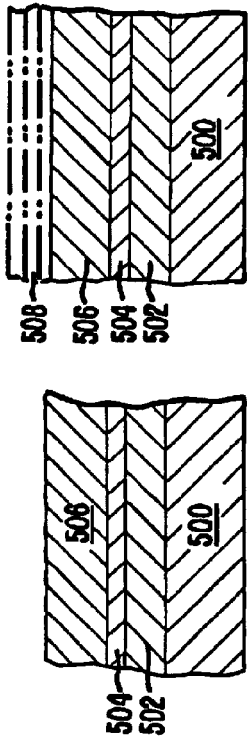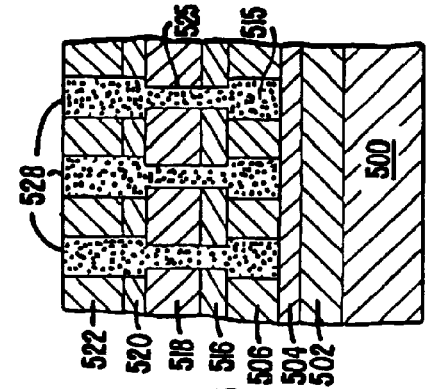

SILICON CARBIDE DEPOSITED BY HIGH DENSITY PLASMA CHEMICAL-VAPOR DEPOSITION WITH BIAS

BACKGROUND OF THE INVENTION

In conventional integrated circuit fabrication, circuit elements are formed by etching a pattern of gaps in a layer of metal such as aluminum. The gaps are then filled with a dielectric such as silicon dioxide. Copper has increasingly been used as an on-chip conductor for all types of integrated circuitry because of its lower resistance when compared with aluminum alloys. It is, however, difficult to etch copper and, as a result, damascene processes have been developed particularly for the fabrication of copper-based integrated circuits. In such damascene processes, dielectric layers are deposited to form an integrated stack and then etched to form gaps that are subsequently filled with copper.

Fluorosilicate glass ("FSG") is an attractive replacement for conventional silicon dioxide as an intermetal dielectric for damascene structures. Not only can FSG be deposited with a conventional high-density-plasma ("HDP") chemical-vapor-deposition ("CVD") system, it also has a good process scheme in terms of reliability, stability, and throughput. The electrical performance of integrated circuits is generally significantly improved by the lower dielectric constant of FSG (k about 3.3–3.6) as compared with conventional silicon oxides (k about 4.1–4.3). The lower dielectric constant reduces the capacitance between metal lines in the same layer and reduces crosstalk across layers.

The dielectric layers that separate layers of copper in a damascene structure are often referred to as intermetal dielectric ("IMD") layers. Such IMD layers typically include a barrier layer to prevent diffusion of copper into adjacent dielectric layers such as FSG. Some integrated stacks used in damascene processes also use an etch stop or hardmask to provide for selective etching of the layer. Silicon nitride $Si_xN_y$ is commonly used for such a barrier layer in damascene applications, such as when forming vias between layers containing metal lines. The dielectric constant for silicon nitride is, however, about 7.0 to 7.5, substantially higher than for either conventional undoped silicon oxide or FSG. As a consequence, a dielectric layer containing silicon nitride has an undesirably high fringe capacitance.

Accordingly, silicon-carbon-hydrogen-based low-k barrier layers, such as Applied Materials' BLOK™, have been developed. Such low-k barrier layers are typically deposited by plasma-enhanced chemical-vapor deposition ("PECVD") using trimethylsilane ("TMS"). While the deposition of BLOK™ provides capping solutions suitable for numerous processes, alternative applications remain desirable to enhance process integration. In addition, it is generally desirable that there be a process capable of depositing a SiC-based layer with a high refractive index, good hardness, and low current leakage.

There thus remains generally a need in the art for an inexpensive method for depositing a SiC-based layer with materials properties that make it suitable for particular desired applications.

SUMMARY OF THE INVENTION

Embodiments of the invention provide a method for depositing a SiC-based layer on a substrate. The resulting layer has desirable materials properties, including a low dielectric constant, good hardness, and an electrical breakdown voltage suitable for fuse applications. The layer deposited according to embodiments of the invention thereby finds applications as a barrier layer in dual damascene structures, in printer-head structures, in packaging structures, and in programmable logic devices.

The layer is deposited on a substrate having an electrical resistivity between about 1 and 100 Ωcm. The substrate is disposed in a process chamber. A gaseous mixture comprising a silicon-containing gas and a hydrocarbon-containing gas is flowed to the process chamber. A high-density plasma, having an ion density greater than about $10^{11}$ ions/cm$^3$ is generated from the plasma. A small electrical bias, between about 0.65 and 1.30 W/cm$^2$, is applied to the substrate. The low bias compensates for an unexpected cooling that results when depositing the SiC-based layer but is low enough that implantation of hydrogen is minimized.

In one embodiment, the hydrocarbon-containing gas is provided to the process chamber with flow rate that is between 10 and 30 times as great as the flow rate for the silicon-containing gas. The resulting SiC-based layer may have an atomic C:Si ratio less than 7:1. In some embodiments, the hydrocarbon-containing gas comprises an alkane and the silicon-containing gas comprises a silane. The gaseous mixture may also include an inert gas, such as Ar.

The methods of the present invention may be embodied in a computer-readable storage medium having a computer-readable program embodied therein for directing operation of a substrate processing system. Such a system may include a process chamber, a plasma generation system, a substrate holder, a gas delivery system, and a system controller. The computer-readable program includes instructions for operating the substrate processing system to form a thin layer on a substrate disposed in the processing chamber in accordance with the embodiments described above.

A further understanding of the nature and advantages of the present invention may be realized by reference to the remaining portions of the specification and the drawings.

BRIEF DESCRIPTION OF THE DRAWINGS

The present invention, as well as its advantages and features, is now described in detail with reference to the accompanying drawings. In some instances, several figures are identified as subparts. Reference to such a group of figures generically without specific reference to a subpart is intended to refer to all subparts of the figure.

FIGS. 6A–6H depict cross sections of a partially formed integrated circuit undergoing an integrated dual-damascene process according to an embodiment of the present invention;

DESCRIPTION OF THE SPECIFIC EMBODIMENTS

1. Introduction

Figure 1A:
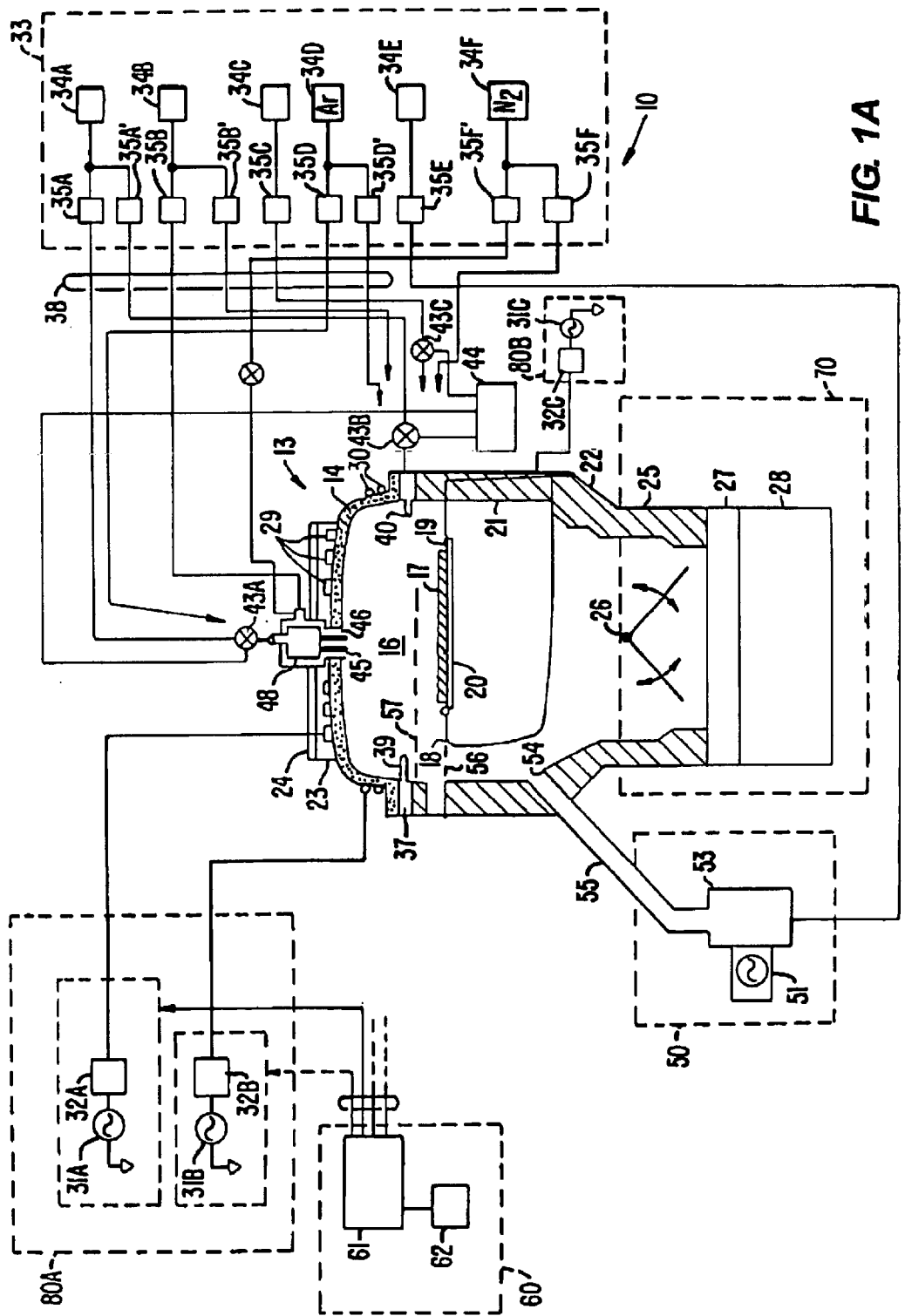
FIG. 1A is a simplified diagram of one embodiment of a high-density-plasma chemical-vapor-deposition system.

Embodiments of the invention thus permit deposition of a low-k SiC layer with an HDP-CVD process that uses a gaseous mixture that includes a hydrocarbon-containing gas such as methane and a silicon-containing gas such as silane. The plasma has a high density, meaning that the ion density exceeds $10^{11}$ ions/cm$^3$. By applying a small RF bias to the substrate during deposition of the SiC layer, it forms with materials properties that make it widely suitable for a variety of applications. For example, the low dielectric constant makes the layer suitable as a barrier to Cu diffusion in dual damascene semiconductor structures. The layer also has a large breakdown voltage and low leakage current density, making it especially suitable for fuse applications in, for example, programmable logic devices. The layer has a large hardness, which makes it suitable, for example, for packaging and printer-head applications.

Hydrocarbon gases generally contain only carbon and hydrogen in a formula of the type $C_xH_m$. Such hydrocarbon compounds include alkanes having the general formula $C_xH_{x+2}$. Typical alkanes include methane $CH_4$, ethane $C_2H_6$, butane $C_3H_8$, propane $C_4H_{10}$, pentane $C_5H_{12}$, hexane $C_6H_{14}$, etc. These compounds are inexpensive, readily available at high purity (e.g., electronic or CMOS grade), nonproprietary, and are normally gases at ambient temperature and pressure. Alternatively, other hydrocarbons, including alkenes or alkynes such as acetylene $C_2H_2$ may be used as the hydrocarbon-containing gas. The term "hydrocarbon" as used herein also includes all isomers of the various alkanes, alkenes, alkynes, and other hydrocarbons. Additionally, the hydrocarbon-containing gas may be a mixture that includes two or more different types of hydrocarbon compounds.

The silicon-containing gas is generally a hydride of silicon having the general formula $Si_yH_n$. Hydrides of silicon include silanes having the general formula $Si_yH_{2y+2}$. Such silanes include monosilane $SiH_4$, disilane $Si_2H_6$, trisilane $Si_3H_8$, tetrasilane $Si_4H_{10}$, pentasilane $Si_5H_{12}$, hexasilane $Si_6H_{14}$, etc. Alternative silicon-containing gases include halides of silicon such as silicon tetrafluoride $SiF_4$ and silazanes. The silicon-containing gas may also be a mixture that includes two or more different types of hydrides of silicon or other silicon compounds.

In the plasma, the hydrocarbon- and silicon-containing gases are dissociated and react to form a layer on a surface of the substrate. In some embodiments, the gaseous mixture may also include an inert gas, such as argon Ar, to promote gas dissociation. Gas dissociation is also further promoted by the high plasma density of the HDP process. The high plasma density is also desirable for barrier-layer deposition when forming integrated stacks, including an IMD layer since HDP-CVD can deposit other layers of the stack, such as an FSG layer. Deposition with HDP-CVD of both the barrier layer and the FSG layer enhances process integration since a barrier layer typically lies on top of or underneath an FSG layer in the stack.

The refractive index and other properties of the barrier layer depend on the relative content of carbon in the deposited layer. Generally, the higher the carbon content in the layer, the lower the refractive index. To provide deposited SiC-based layers having a refractive index greater than 2.0, the atomic ratio of carbon to silicon in the layer should be less than about 7:1. As described below, suitable adjustment of the ratio of the flows of the hydrocarbon-containing gas to the silicon-containing gas controls the relative carbon content in the deposited layer.

An unusual discovery of the inventors regarding the deposition of SiC-based layers with hydrocarbon- and silicon-containing gas flows is the need for careful temperature control of the substrate. Unlike the deposition of many varied types of layers, including undoped silicon oxide, phosphorus-doped silicon oxide, fluorine-doped silicon oxide, silicon nitride, and SiON, the temperature of the substrate tends to decrease as the deposition of the SiC-based layer progresses by HDP-CVD. The decrease in temperature has been observed to be as great as 50° C. within 120 seconds of the deposition. It is speculated that freon may be formed in the plasma and then acts as a refrigerant to cool the wafer.

Regardless of the actual mechanism that causes the cooling, controlling the substrate temperature improves the depth homogeneity of the SiC-based layer as it is deposited. It has been found that the substrate temperature is not adequately controlled simply with source power for a number of reasons. For example, there is considerable diversity in the materials properties of substrates, which may include, for example, patterned, nonpatterned, low- and high-resistivity wafers. This diversity renders the application of source RF power is inconsistent. Also, the efficiency of substrate heating is highly dependent on it surface properties, with metallic-covered substrates tending to reflect heat and oxide-covered substrates tending to store heat. Furthermore, chamber-to-chamber matching issues are significant when source RF power is used as a substrate heating mechanism.

Accordingly, embodiments of the invention apply electrical bias to the substrate to deposit SiC-based layers using HDP-CVD. The bias power density is generally between about 0.65 and 1.30 W/cm$^2$. For a 200-mm wafer, this corresponds to a power range of about 200–400 W, and for a 300-mm wafer corresponds to a power range of about 450–900 W. This should be contrasted with the bias typically applied in, for example, gapfill applications where sputter is desirable; there the bias power density is typically on the order of 25 W/cm². The application of the relatively very low bias during HDP deposition of SiC-based layers, however, results in an increased refractive index, mitigates low-temperature outgassing, and results in a layer having the same bonding structure as HDP-CVD SiC deposited without the application of bias.

Bias power has not normally been used in such deposition processes for two reasons. First, the plasma contains hydrogen that is readily dissociated from the alkane and silane gases, and ionized in the high-density plasma. The application of bias to the substrate tends to energize the resulting hydrogen ions, causing them to bombard the wafer. If the bias is sufficiently high, this results in implantation of hydrogen into the wafer, which is normally undesirable since implanted hydrogen can easily diffuse into elements of the integrated-circuit device structures that may be formed on the substrate. Second, if an inert gas such as argon is present in the high-density plasma, the application of bias will tend to increase its effect as a sputtering agent by causing Ar ions to bombard the substrate energetically. The energetic bombardment can sputter material from the substrate, causing sputtered material to be deposited on the walls of the chamber and thereby requiring more frequent cleaning. Perhaps more importantly, however, argon sputtering can also break bonds, such as Si—C bonds, in the layer being deposited, thereby making the deposited layer more susceptible to moisture absorption.

Copending and commonly assigned U.S. application Ser. No. 09/431,411, filed Nov. 1, 1999 by Hichem M'Saad et al. and entitled "BARRIER LAYER DEPOSITION USING HDP-CVD," the entire disclosure of which is herein incorporated by reference for all purposes, teaches the application of a low bias power for deposition of SiC-based layers on low-resistivity wafers. In particular, it discloses that RF bias may be used for heating epitaxial silicon ("epi") wafers, which have a resistivity of only 0.01–0.02 Ωcm. By contrast, the inventors have discovered that the application of a low bias power with HDP-CVD can be used to achieve the desired refractive index of SiC-based layers deposited on normal silicon wafers having a resistivity in the range 1–100 Ωcm. The bias power density used, in the range 0.65–1.30 Ωcm, is sufficient to achieve the desired properties and low enough to minimize the potential sputtering and hydrogen implantation problems.

2. Exemplary HDP-CVD Substrate Processing System

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10 C. over a range of about 100 C. to 200 C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 Torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at between 1.8 and 2.2 MHz, nominally at 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. BRF generator 31C provides RF power at a frequency ranging from about 1–100. In a specific embodiment, BRF generator 31C provides up to 5,000 watts of RF power at 13.56 MHz.

RF generators 31A and 31B include digitally controlled synthesizers and operate over a frequency range between about 1.8 to about 2.2 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
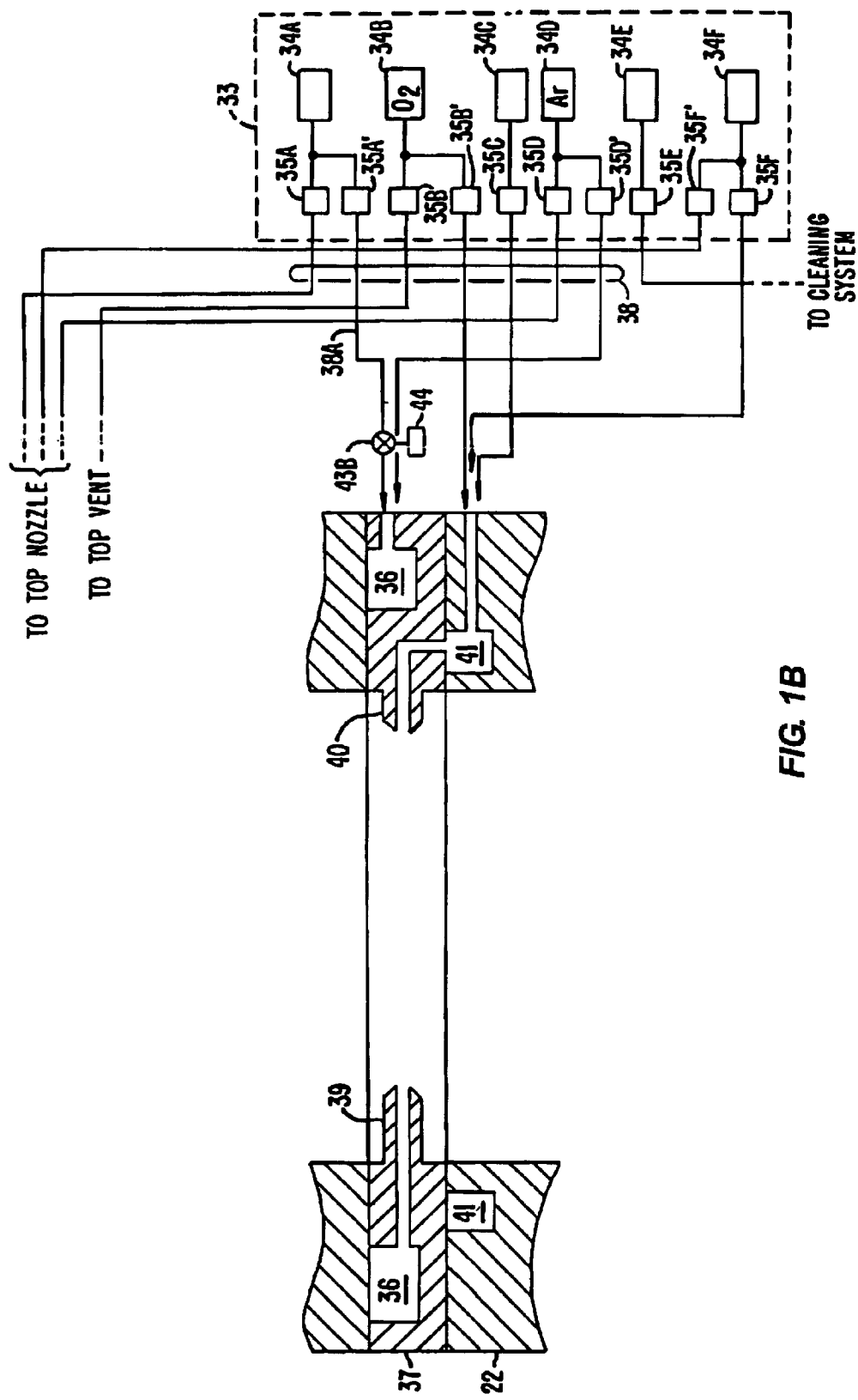
FIG. 1B is a simplified cross section of a gas ring that may be used in conjunction with the exemplary HDP-CVD processing chamber of FIG. 1A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of first source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of second source gas nozzles 40 (only one of which is shown), which in a preferred embodiment are co-planar with and shorter than first source gas nozzles 39, and in one embodiment receive gas from body plenum 41. In some embodiments it is desirable not to mix different types of source gases before injecting the gases into chamber 13. In other embodiments, and source gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. The nitrogen source 34F provides nitrogen gas ($N_2$) to the second source gas nozzles 40 of the gas ring to the chamber for process steps utilizing nitrogen plasma. Alternatively, the nitrogen gas could be delivered to the chamber through other or additional inlets, such as the top nozzle 45 via gas flow controller 35F'. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves layer uniformity and allows fine adjustment of the layer's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of gas to both top vent 46 and second source gas nozzles 40 from a single source, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube (CRT) 65, and a light pen 66, as depicted in FIG. 1C.

Figure 1C:
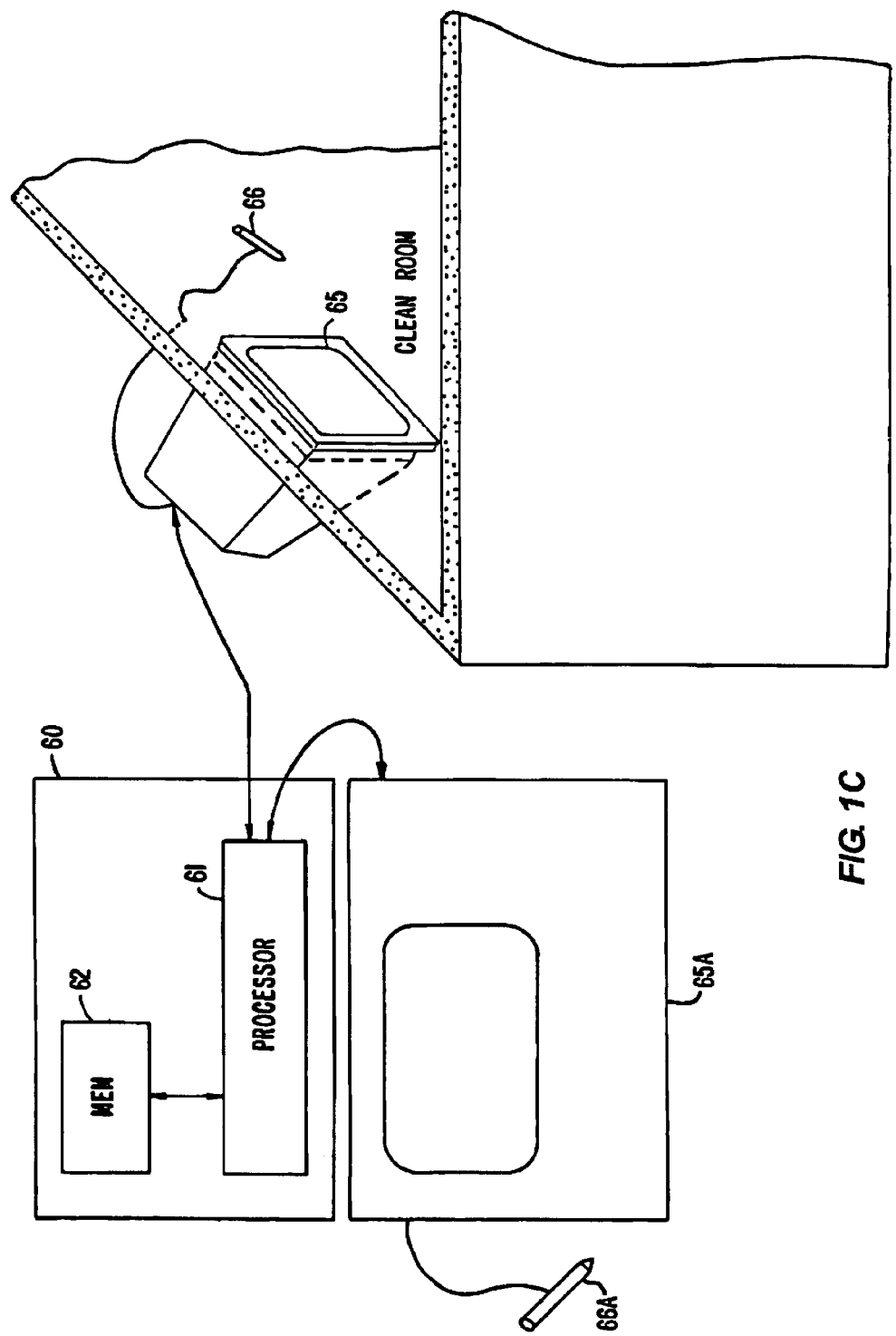
FIG. 1C is a simplified diagram of a monitor and light pen that may be used in conjunction with the exemplary HDP-CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The area touched confirms being selected by the light pen by changing its color or displaying a new menu, for example.

The computer program code can be written in any conventional computer-readable programming language such as 68000 assembly language, C, C++, FORTRAN, Pascal or other language. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
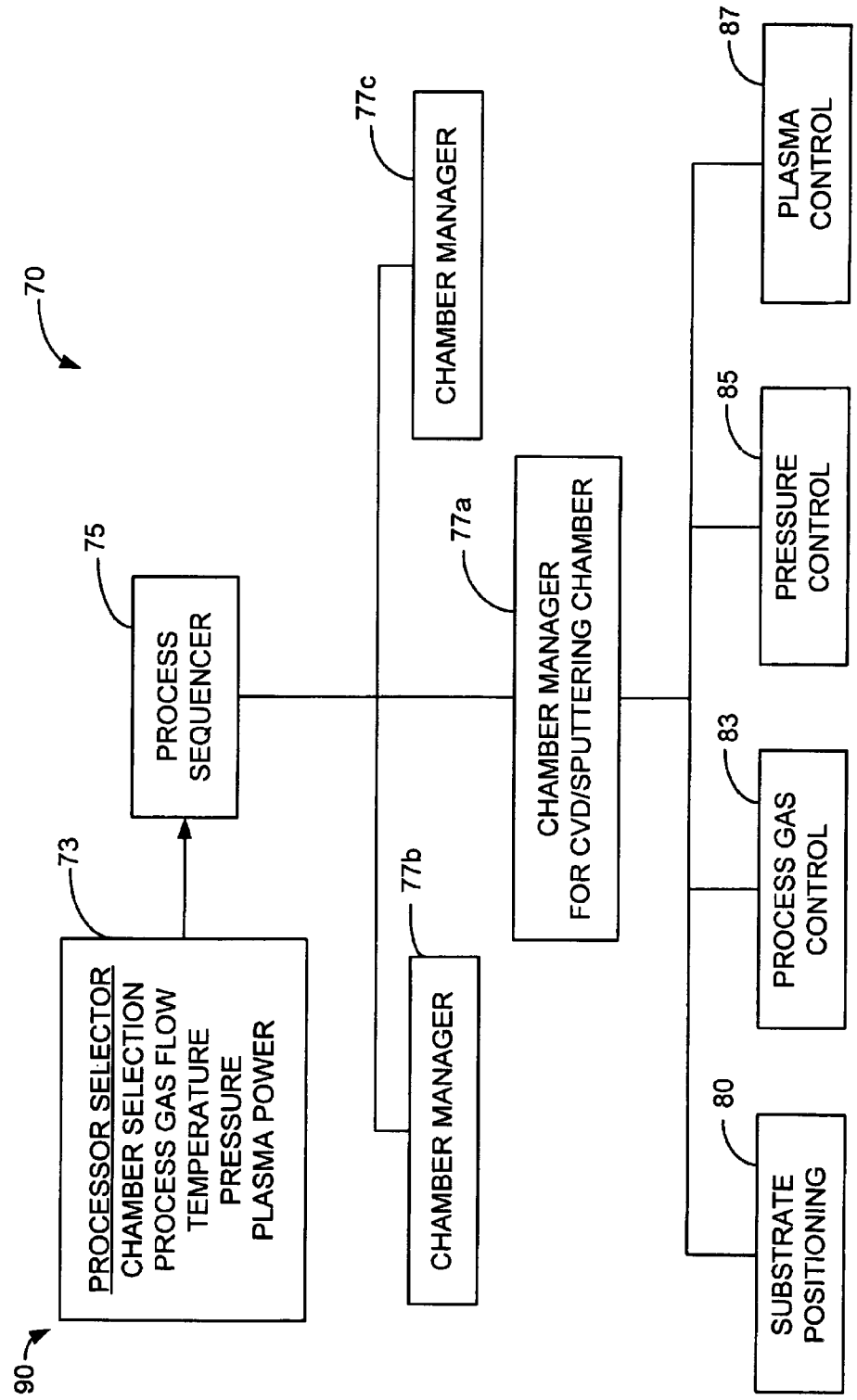
FIG. 1D is a flow chart of an exemplary process control computer program product used to control the exemplary HDP-CVD processing chamber of FIG. 1A.

FIG. 1D shows an illustrative block diagram of the hierarchical control structure of computer program 90. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. Process selector subroutine 73 identifies (i) the desired process chamber in a multichamber system, and (ii) the desired set of process parameters needed to operate the process chamber for performing the desired process. The process parameters for performing a specific process relate to conditions such as process gas composition and flow rates, substrate temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 75 comprises program code for accepting the identified process chamber and set of process parameters from the process selector subroutine 73 and for controlling operation of the various process chambers. Multiple users can enter process set numbers and process chamber numbers, or a single user can enter multiple process set numbers and process chamber numbers; sequencer subroutine 75 schedules the selected processes in the desired sequence. Preferably, sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 can be designed to take into consideration the "age of each particular user-entered request, or the present condition of the process chamber being used in comparison with the desired process conditions for a selected process, or any other relevant factor a system programmer desires to include for determining scheduling priorities.

After sequencer subroutine 75 determines which process chamber and process set combination is going to be executed next, sequencer subroutine 75 initiates execution of the process set by passing the particular process set parameters to a chamber manager subroutine 77a–c, which controls multiple processing tasks in chamber 13 and possibly other chambers (not shown) according to the process set sent by sequencer subroutine 75.

Examples of chamber component subroutines are substrate positioning subroutine 80, process gas control subroutine 83, pressure control subroutine 85, and plasma control subroutine 87. Those having ordinary skill in the art will recognize that other chamber control subroutines can be included depending on what processes are selected to be performed in chamber 13. In operation, chamber manager subroutine 77a selectively schedules or calls the process component subroutines in accordance with the particular process set being executed. Chamber manager subroutine 77a schedules process component subroutines in the same manner that sequencer subroutine 75 schedules the process chamber and process set to execute. Typically, chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a PECVD reactor or other reactor in the multi-chamber system, after other processing has been completed.

Process gas control subroutine 83 has program code for controlling process gas composition and flow rates. Subroutine 83 controls the open/close position of the safety shut-off valves and also ramps up/ramps down the mass flow controllers to obtain the desired gas flow rates. All chamber component subroutines, including process gas control subroutine 83, are invoked by chamber manager subroutine 77a. Subroutine 83 receives process parameters from chamber manager subroutine 77a related to the desired gas flow rates.

Typically, process gas control subroutine 83 opens the gas supply lines, and repeatedly (i) reads the necessary mass flow controllers, (ii) compares the readings to the desired flow rates received from chamber manager subroutine 77a, and (iii) adjusts the flow rates of the gas supply lines as necessary. Furthermore, process gas control subroutine 83 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 83 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 83 may include steps for bubbling a delivery gas such as helium through the liquid precursor in a bubbler assembly or for introducing the helium to a liquid injection valve. For this type of process, the process gas control subroutine 83 regulates the flow of the delivery gas, the pressure in the bubbler, and the bubbler temperature to obtain the desired process gas flow rates. As discussed above, the desired process gas flow rates are transferred to process gas control subroutine 83 as process parameters.

Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 83 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 85 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 85, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 85 is invoked, the desired, or target, pressure level is received as a parameter from chamber manager subroutine 77a. Pressure control subroutine 85 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 85 may open or close throttle valve 26 to a particular opening size to regulate the pressure in chamber 13 to a desired pressure or pressure range.

Plasma control subroutine 87 comprises program code for controlling the frequency and power output setting of RF generators 31A and 31B and for tuning matching networks 32A and 32B. Plasma control subroutine 87, like the previously described chamber component subroutines, is invoked by chamber manager subroutine 77a.

An example of a system that may incorporate some or all of the subsystems and routines described above would be the ULTIMA™ system, manufactured by APPLIED MATERIALS, INC., of Santa Clara, Calif. configured to practice the present invention. Further details of such a system are disclosed in U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

3. Exemplary Structures

Figure 2:
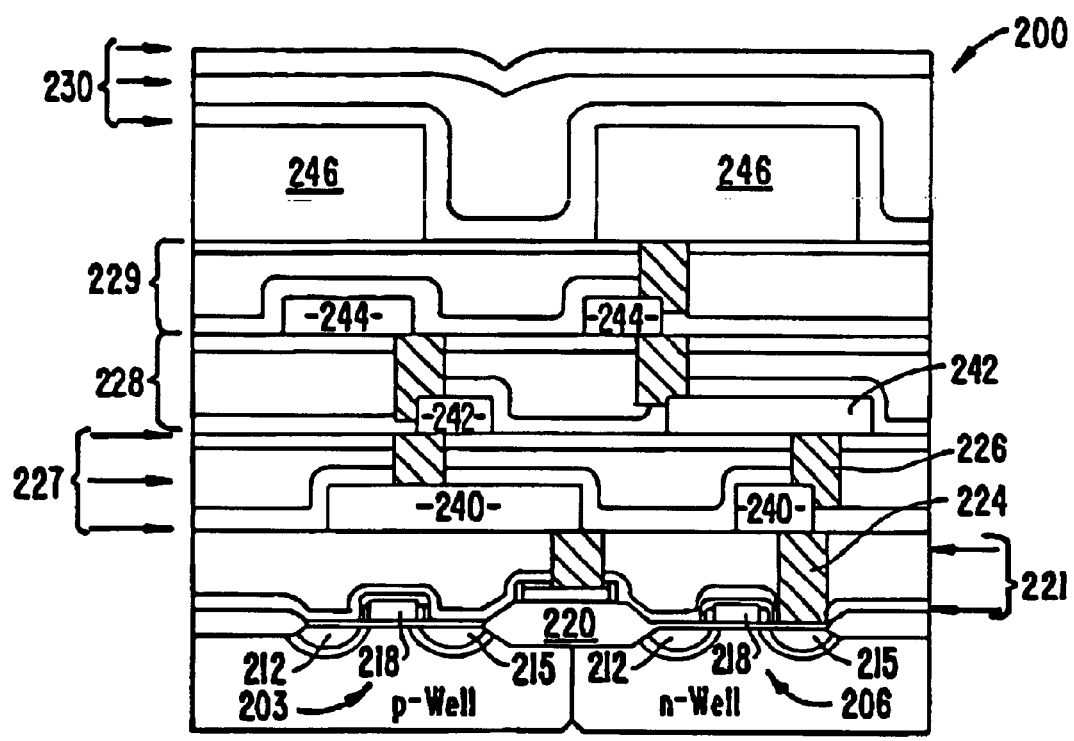
FIG. 2 is a simplified cross-sectional view of a semiconductor device manufactured according to a method embodiment of the present invention.

FIG. 2 illustrates a simplified cross-sectional view of an integrated circuit 200, which may be made in accordance with use of the present invention. As shown, integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by a groove trench isolation (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers, 240, 242, 244 and 246, included in integrated circuit 200. Each metal layer 240, 242, 244, and 246 is separated from adjacent metal layers by respective inter-metal dielectric (IMD) layers 227, 228, or 229. Adjacent metal layers are connected at selected openings by vias 226. Deposited over metal layer 246 are planarized passivation layers 230.

It should be understood that simplified integrated circuit 200 is for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to PMOS, NMOS, CMOS, bipolar, or BiCMOS devices.

a. Exemplary Barrier-layer Deposition

Figure 3A:
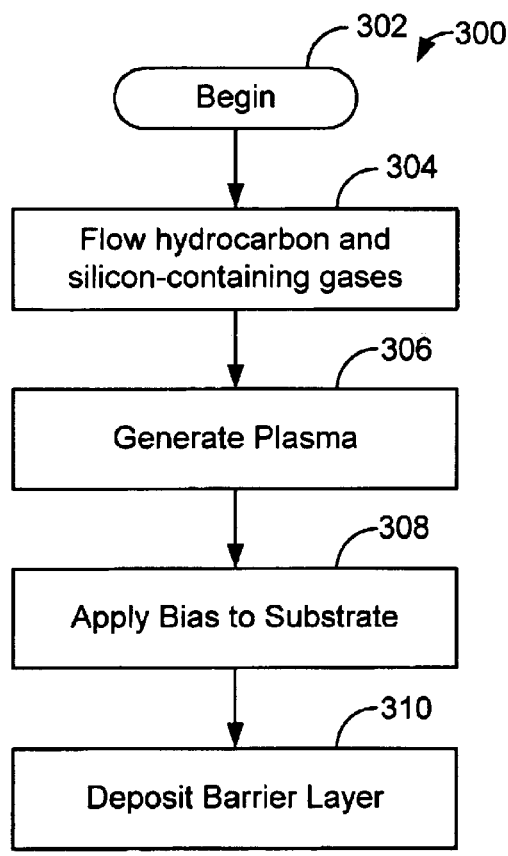
FIG. 3A is a flow diagram of a first method embodiment of the present invention.
Figure 3B:
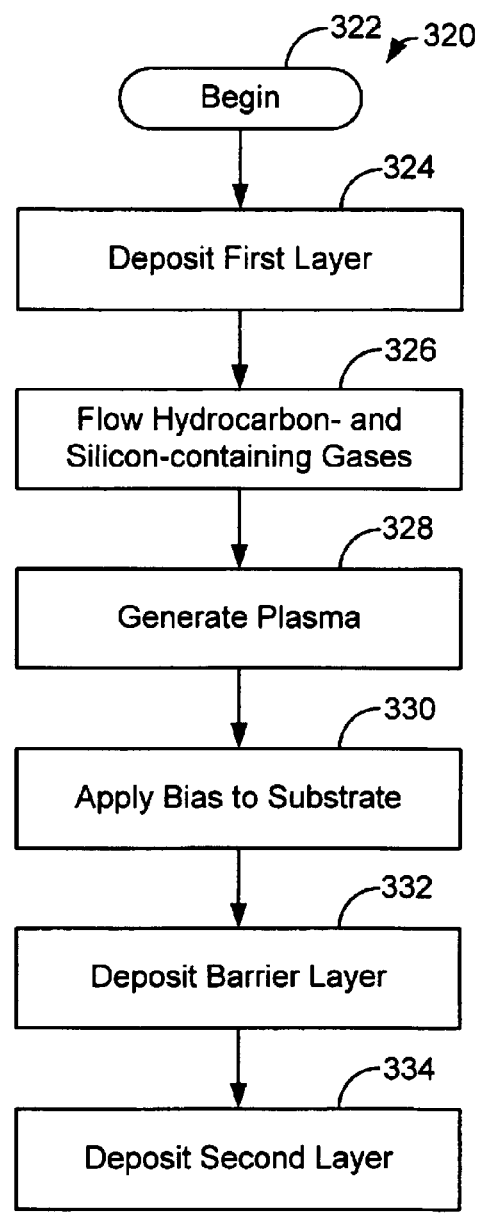
FIG. 3B is a flow diagram of a second method embodiment of the present invention.
Figure 4A:
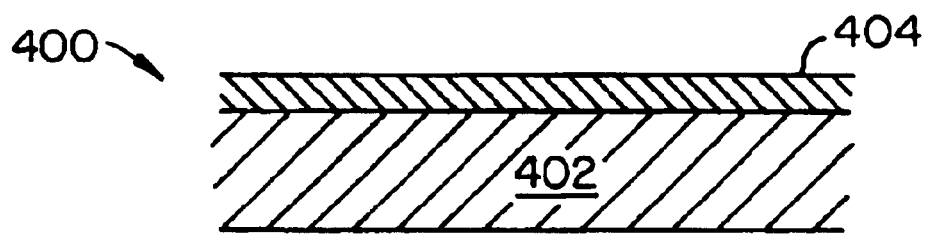
FIG. 4A is a cross-sectional view of an integrated stack deposited according to the first method embodiment.
Figure 4B:
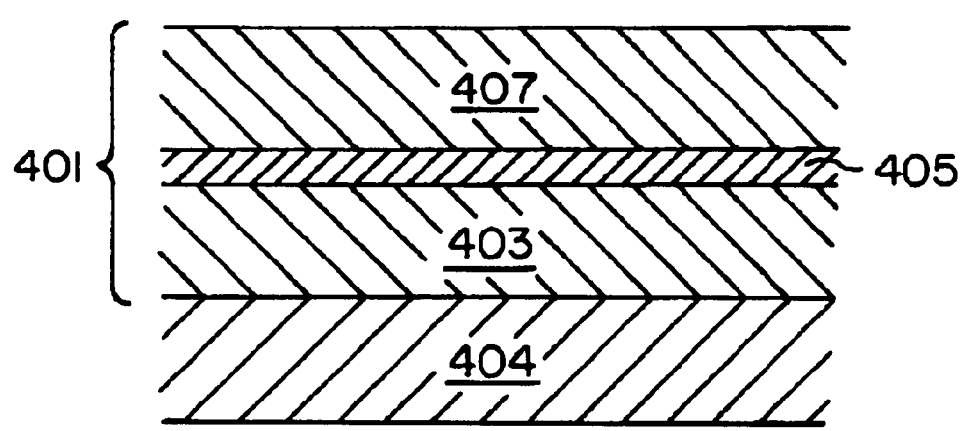
FIG. 4B is a cross-sectional view of an integrated stack deposited according to the second method embodiment.
Figure 5:
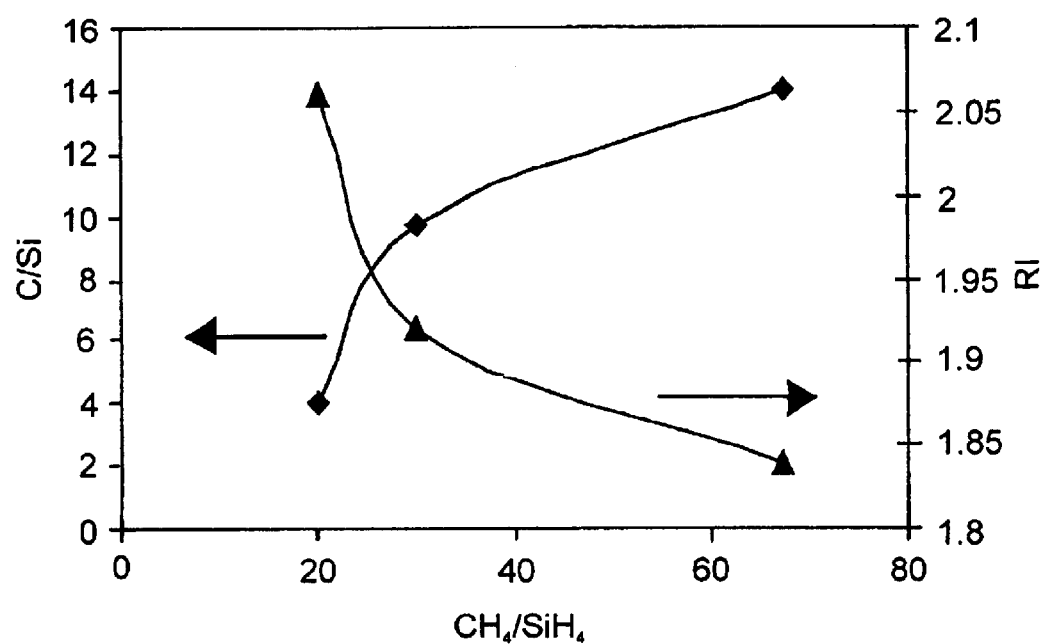
FIG. 5 is a plot of the dependence of the atomic C:Si ratio and refractive index of a deposited layer as a function of relative flow rates for the hydrocarbon- and silicon-containing gases for an embodiment of the invention.

Certain applications of the invention provide for deposition of a low-dielectric-constant barrier layer. Such applications may be understood with reference to FIGS. 3A–4B. FIGS. 3A and 3B depict flow diagrams of two embodiments that may be used for depositing such a barrier layer. FIGS. 4A and 4B correspondingly depict integrated stack structures deposited in accordance with the flow diagrams of FIGS. 3A and 3B.

The first of the two embodiments may be understood by referring to FIGS. 3A and 4A. FIG. 3A shows a flow diagram of a method 300 for depositing a structure 400 having a barrier layer 404. The method 300 begins at block 302. At block 304, a gaseous mixture having flows of hydrocarbon- and silicon-containing gases is introduced to a process chamber such as chamber 13. Typically, the hydrocarbon-containing gas is an alkane gas and the silicon-containing gas is a silane gas. The gaseous mixture may also include an inert gas such as argon. The chamber pressure is typically maintained between 5 and 20 mtorr, and the chamber temperature is typically maintained between 120 and 160° C.

The desired materials properties of the barrier layer 404, including its dielectric constant k and refractive index, depend on the ratio of carbon to silicon atoms in the layer. As stated above, a refractive index greater than 2.0 can be achieved with an atomic ratio of carbon to silicon in the layer ("C:Si ratio") less than about 7:1. The C:Si ratio in the layer depends in turn on the ratio of carbon to silicon atoms in the gaseous flows. This may be understood with reference to FIG. 6, which provides a plot of the C:Si ratio and the refractive index as a function of the relative flow rate of $CH_4$ to $SiH_4$ in an embodiment that uses those gas flows. The C:Si ratio was determined by secondary-ion mass spectroscopy ("SIMS"). The results are plotted for a 200-mm wafer, a source power of 1200+2550 W (where the number preceding the "+" is the power from side sources and the number following the "+" sign is the power from top sources) and a bias power of 300 W. The methane $CH_4$ flow rate is 200+0 sccm (where the number preceding the "+" is again from side sources and the number following the "+" sign is from top sources). The left ordinate shows the C:Si ratio in the layer and corresponds to the diamond data points.

The right ordinate shows the refractive index and corresponds to the triangular data points. The general trend that the C:Si ratio increases with an increase in the relative flow rate of the hydrocarbon-containing gas to the silicon-containing gas is evident, as is the trend that the refractive index simultaneously decreases. While the C:Si ratio is expected to be approximately linear with the relative flow rate in the absence of a substrate bias, some nonlinearity attributable to the bias can be seen in the figure, particularly at lower relative flow rates.

It has been discovered that the refractive index may be used to characterize different process regimes. For a refractive index less than about 1.8, the SiC layer has a columnar structure; for a refractive index between about 1.8 and 2.0, the SiC layer has an amorphous graphite structure; and for a refractive index greater than about 2.0, the SiC layer has a hydrogenated amorphous carbon structure.

The gas mixture is energized at block 306 to form a plasma for depositing the barrier layer 404 on a substrate 402, such as silicon. For HDP-CVD applications, the plasma has an ion density of about $10^{11}$ ions/cm$^3$ or greater. The plasma may be generated by any suitable plasma generating system, such as source plasma system 80A and/or bias plasma system 80B of FIG. 1A. For example, in an HDP chamber such as chamber 13, between 1000 and 1500 W of RF power are applied to top coil 29 and between 2000 and 3500 W applied to side coil 30 for a 200-mm wafer. A bias with a power density between about 0.65 and 1.30 W/cm$^2$ (200–400 W for a 200-mm wafer) is applied to the substrate at block 308 so that the barrier layer 404 is deposited at block 310. Appropriate flow rates when using $CH_4$, $SiH_4$, and Ar are between 150 and 300 sccm of $CH_4$, between 150 and 250 sccm of Ar, and a relative flow rate of $CH_4$ to $SiH_4$ between 10 and 30.

A barrier layer such as barrier layer 404 may be part of an integrated stack that comprises several layers of material as shown in FIG. 4B. The method of FIG. 3A can thus be modified as shown in FIG. 3B to produce such a multilayered integrated stack. The integrated stack 401 generally comprises a first layer of material 403, a barrier layer 405, and a second layer of material 407. The first and second layers 403 and 407 may comprise any type of material, including dielectric materials, semiconducting materials, and metals. Layers 403 and 407 may be made of the same type of material or of different types depending on the specific application. Furthermore, integrated stack 401 may include any number of different layers. The first and second layers 403 and 407 may be deposited by any conventional means, including PECVD, subatmospheric CVD ("SACVD"), atmospheric-pressure CVD ("APCVD"), plasma-assisted CVD ("PACVD"), in addition to HDP-CVD. However, from a standpoint of process integration, it is more convenient to deposit all the layers in the same chamber used for the barrier layer deposition. Thus, for deposition of a SiC-based barrier layer with HDP-CVD, it is convenient to use HDP-CVD to deposit the first and second layers 403 and 407.

In an exemplary version of this embodiment, stack 401 is deposited on a substrate 409, such as a semiconductor wafer. In this embodiment the method 320 begins at block 322. The first layer is deposited at block 324 and a gaseous mixture with hydrocarbon- and silicon-containing gases is introduced to a process chamber containing substrate 409 at block 326. The gaseous mixture is energized at block 328 to form a high-density plasma and a bias is applied to the substrate 409 at block 330 for depositing the barrier layer 405 at block 332. The barrier layer 405 need not be very thick compared to the overall desired thickness of the integrated stack 401. In one exemplary embodiment, the barrier layer 405 amounts to between about 500–1000 Å out of a stack 401 having a total thickness of approximately 10,000 Å. Following deposition of barrier layer 405, second layer 407 may be deposited at block 334. In one embodiment, both the first and second layer 403 and 407 comprise layers of FSG deposited by HDP-CVD using $SiH_4$, $SiF_4$, $O_2$, and Ar.

b. Exemplary Damascene Process

The barrier layer and integrated stack deposition described above with respect to FIGS. 3A–4B may be used in a damascene process. A damascene structure may include, for example, as many as 10–12 barrier layers of the type described above in IMD layers or as etch stop layers. An example of a dual-damascene process integration scheme that uses the barrier-layer deposition described above in forming an IMD layer is depicted in FIGS. 6A–6H. The dual damascene process begins with the deposition of an oxide layer 502 over a silicon substrate 500 as shown in FIG. 6A. A first Si—C-type barrier layer 504 is deposited over oxide layer 502 using the alkane/silane deposition process described above, e.g., by HDP-CVD using $SiH_4$ and $CH_4$. In some applications layer 504 acts as a hardmask or etch-stop layer. A first FSG layer 506 is deposited and covered with a patterned photoresist layer 508 during a first photolithography as shown in FIG. 6B. First FSG layer 506 may be deposited in the same HDP chamber to enhance process integration. In FIG. 6C, a first etch forms a first set of gaps 510 in first FSG layer 506 down to hardmask layer 504.

After the first etch, photoresist 508 is stripped, e.g., by ashing in an oxidizing environment. Gaps 510 and first FSG layer 506 are then covered with a layer of metal, such as aluminum or copper. In the case of copper, a seed layer 512 (FIG. 6C) is deposited over gaps 510 and first FSG layer 506. A first bulk copper layer 514 is deposited to fill the gaps 510 as shown in FIG. 6D. In some applications, a barrier layer (not shown) is deposited over first FSG layer 516 and gaps 510 prior to deposition of seed layer 512. The barrier layer prevents interdiffusion of copper and FSG. Copper layer 514 is planarized, e.g., by chemical mechanical polishing ("CMP"). Planarization of copper layer 514 forms, e.g., a first set of metal lines 515 in an interconnect structure.

After planarization of copper layer 514, a second barrier layer 516, a second FSG layer 518, a third barrier layer 520, and a third FSG layer 522 are deposited to form an IMD layer 521 as shown in FIG. 6E. Layers 518, 520, and 522 may be deposited in the same HDP chamber to enhance process integration for forming IMD layer 521. A second lithography and etch forms vias 524 through layers 516, 518, 520 and 522 down to copper layer 514 as shown in FIG. 6F. In FIG. 6G, a third lithography and etch forms a second set of gaps 526. Gaps 526 define a second set of metal lines and vias 524 define a set of interconnects between the second set of metal lines and the first set of metal lines defined by gaps 510 and copper layer 514. Vias 524 and gaps 526 are then filled with a second bulk copper layer and the resulting structure is annealed and planarized as shown in FIG. 6H. Gaps 526 define a second set of metal lines 528 and vias 524 define a set of interconnects 525 between the second set of metal lines 528 and the first set of metal lines 515.

Damascene processes are used in devices that use copper interconnects because there is currently no acceptable way to etch copper. Structures formed by damascene processes do not require a gap-fill dielectric and generally provide lower RC delays than similar structures formed using metal lines aluminum, tungsten, titanium or other metals.

Furthermore, higher deposition rates may be used in damascene processes since gap-fill is not an issue. Any of barrier layers 506, 516 and 520 can be deposited using the alkane-silane barrier layer deposition described above with respect to FIGS. 2–4B. Alternatively, it may be desirable to deposit one or more of barrier layers 506, 516 and 520 as silicon nitride layers. This may be advantageous from a process integration standpoint since, like the FSG and barrier layers, silicon nitride can be deposited by HDP-CVD.

c. Applications

The properties of the SiC-based layers deposited according to embodiments of the invention makes them especially suitable for applications in which good hardness and low current-density leakage are useful. Some examples of such applications are described below, but those of skill in the art will recognize many other applications appropriate for the materials properties of the deposited layers.

One example of an application in which good hardness is beneficial is for printer heads. A typical ink-jet printer uses a non-impact method. Ink is emitted from nozzles as they pass over a variety of possible media, with liquid ink in various colors being squirted at the paper to build up an image. A printer head scans the page in horizontal strips, using a motor assembly to move it from left to right and back, as another motor assembly rolls the paper in vertical steps. The printer head may be fabricated using the techniques described above, the hardness of the barrier layer being useful for ensuring a long life for the printer head when used in this way.

Another application that makes use of good hardness is in the area of packaging. After a wafer is processed, the individual chips on the wafer surface are completed and the electrically functioning ones identified. The chips are subsequently incorporated into an individual protective package, mounted with other components in a hybrid or multichip modules, or connected directly onto a printed circuit board. The hardness of the SiC-based layer is useful in ensuring that the chips are well protected when packaged.

The electrical characteristics of the SiC-based layer, with its moderate breakdown voltage and low current-density leakage, make it especially suitable for fabricating fuses in a programmable logic device ("PLD"). As used herein, the term "programmable logic device" is used broadly to include a variety of devices where the logic may be programmed, including, without limitation, programmable read-only memories ("PROM"), field-programmable gate arrays ("FPGA"), and application-specific integrated circuits ("ASIC"), for example. Such devices typically function by using an array of fuses such as may be formed with the SiC-based layers, and selectively blowing some of those fuses to program the chip with user-specified information.

4. Experimental Results

A typical recipe for using HDP-CVD with substrate bias to deposit a SiC-based layer on a 200-mm wafer is set forth in Table I. The experimental results that follow explore the effect of varying some of the parameters, particularly on the refractive index and electrical properties.

TABLE I

Exemplary Process Recipe

| Parameter | Pre-Deposition | Main Deposition |
|---|---|---|
| Source RF (W) | 1200 + 2700 | 1200 + 2550 |
| Bias RF (W) | 300 | 300 |
| Wafer Temperature Control (° C.) | 340 | 340 |

TABLE I-continued

Exemplary Process Recipe

| Parameter | Pre-Deposition | Main Deposition |
|---|---|---|
| Ar flow (sccm) | 180 | 180 |
| CH$_4$ flow (sccm) | 20 + 0 | 150 + 0 |
| SiH$_4$ flow (sccm) | | 13 + 0 |
| Pressure (mtorr) | 13 | 13 |

Figure 7A:
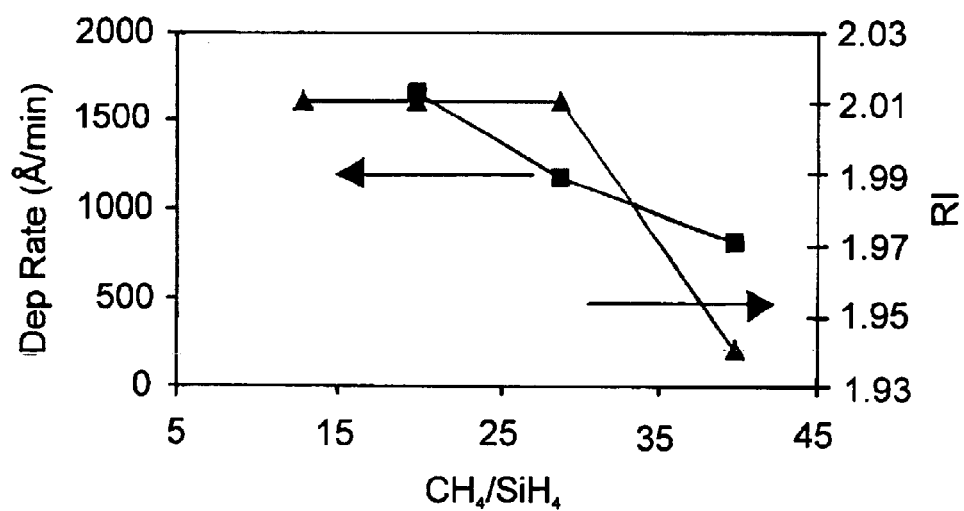
FIG. 7A is a plot of the dependence of the deposition rate and refractive index of a deposited layer as a function of relative flow rates for the hydrocarbon- and silicon-containing gases for an embodiment of the invention.

FIG. 7A shows the effect of varying the relative flow rates of methane to silane on both the deposition rate and the refractive index. The results were obtained for a source power of 1200+2550 W, a bias power of 300 W, a wafer temperature control of 330° C., and a methane flow of 200+0 sccm. Data points were obtained by varying the silane flow, with the abscissa corresponding to the ratio of the methane flow rate to the silane flow rate. The left ordinate shows the deposition rate and corresponds to the square data points, while the right ordinate shows the refractive index and corresponds to the triangular data points. The results show a general trend that the deposition rate decreases with decreasing silane flow. Of note is the fact that there is a large window where the refractive index exceeds 2.0, including when the relative flow of methane to silane is ≦30.

Figure 7B:
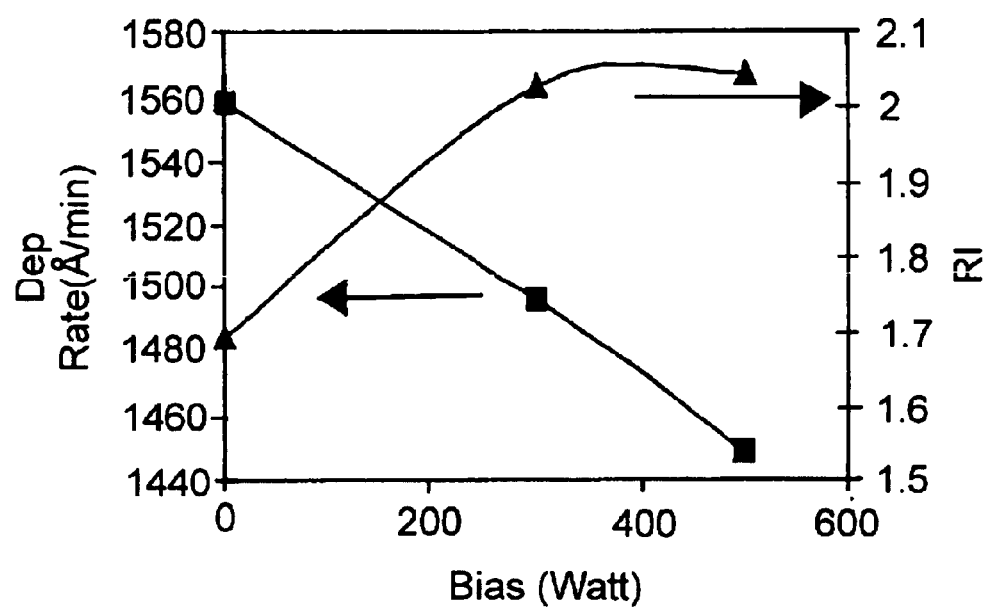
FIG. 7B is a plot of the dependence of the deposition rate and refractive index of a deposited layer as a function of bias power for an embodiment of the invention.

FIG. 7B illustrates the effect of varying the bias power on both the deposition rate and refractive index. The results were obtained for a source power of 1200+2550 W, a wafer temperature of 350° C., a silane flow of 7+3 sccm, and a methane-to-silane flow ratio of 20 (corresponding to a methane flow of 140+60 sccm). The left ordinate shows the deposition rate and corresponds to the square data points, while the right ordinate shows the refractive index and corresponds to the triangular data points. The results show that the deposition rate decreases with increasing bias power. The results for the refractive index are of particular interest. At zero bias power, the refractive index of the deposited SiC layer is about 1.7. This can be raised to above 2.0 by application of the low bias power, with a large window for a >2.0 refractive index being achieved for a bias power ≧300 W.

Figure 7C:
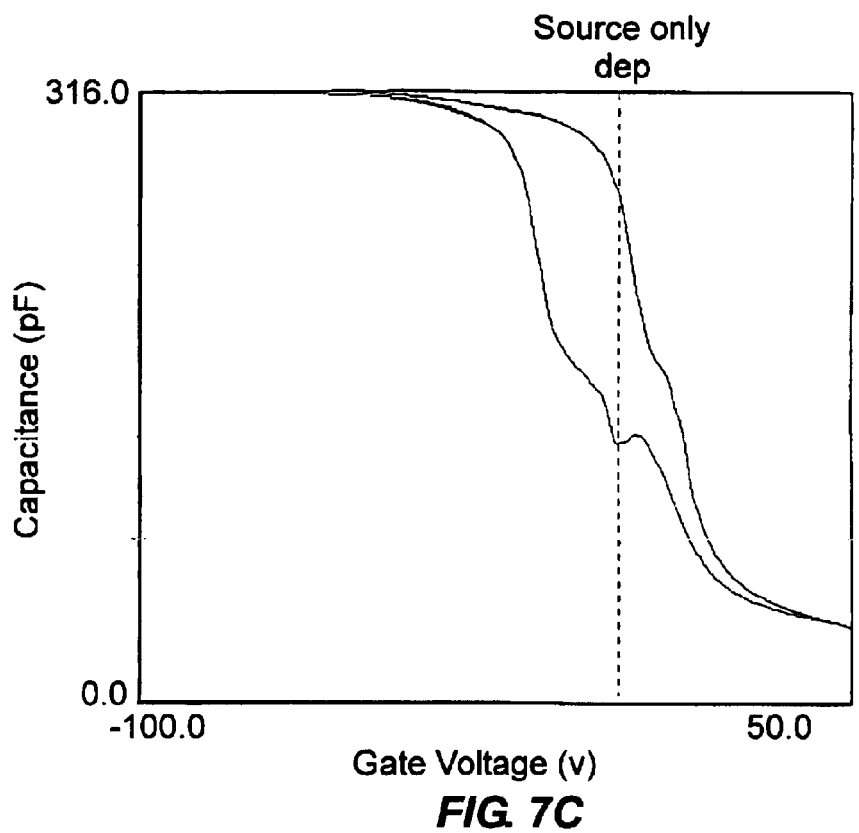
FIGS. 7C and 7D are capacitance-voltage profiles comparing deposition of a SiC-based layer without and with the application of a bias power.
Figure 7D:
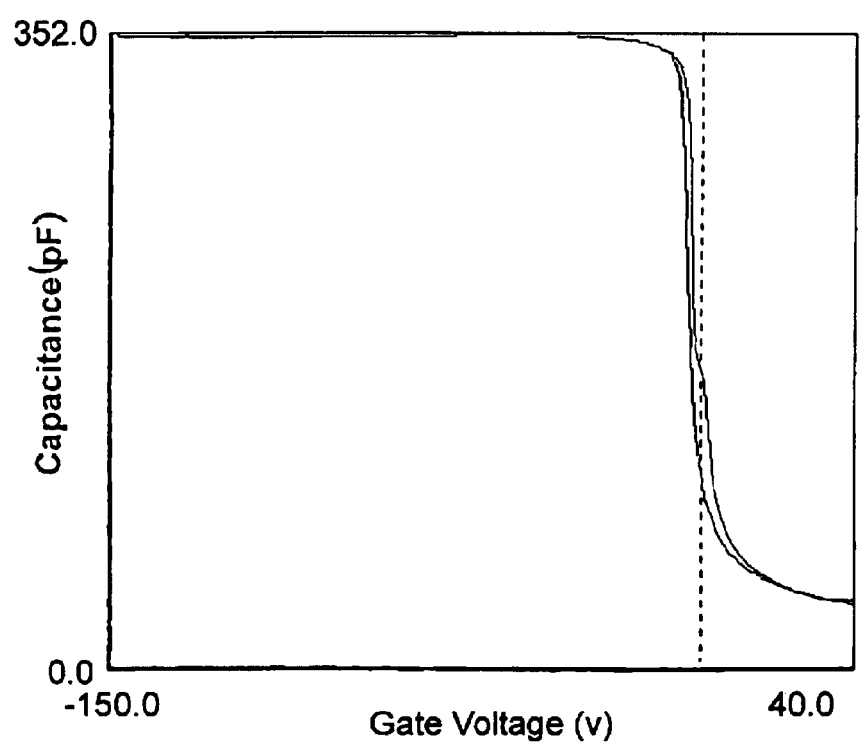

FIGS. 7C and 7D show capacitance-voltage profiles measured respectively for SiC-based layers deposited without and with the application of substrate bias. The recipes used for the deposition were otherwise as set forth in Table I. In FIG. 7C, the profile shows a flat-band voltage shift, which indicates the presence of charges in the deposited layer. By contrast, no flat-band voltage shift is evident in the profile shown in FIG. 7D, which indicates that there is only a low charge density in the deposited layer. Together, these results demonstrate that the application of a small bias has as one effect the reduction of charges within the deposited layer.

Figure 7E:
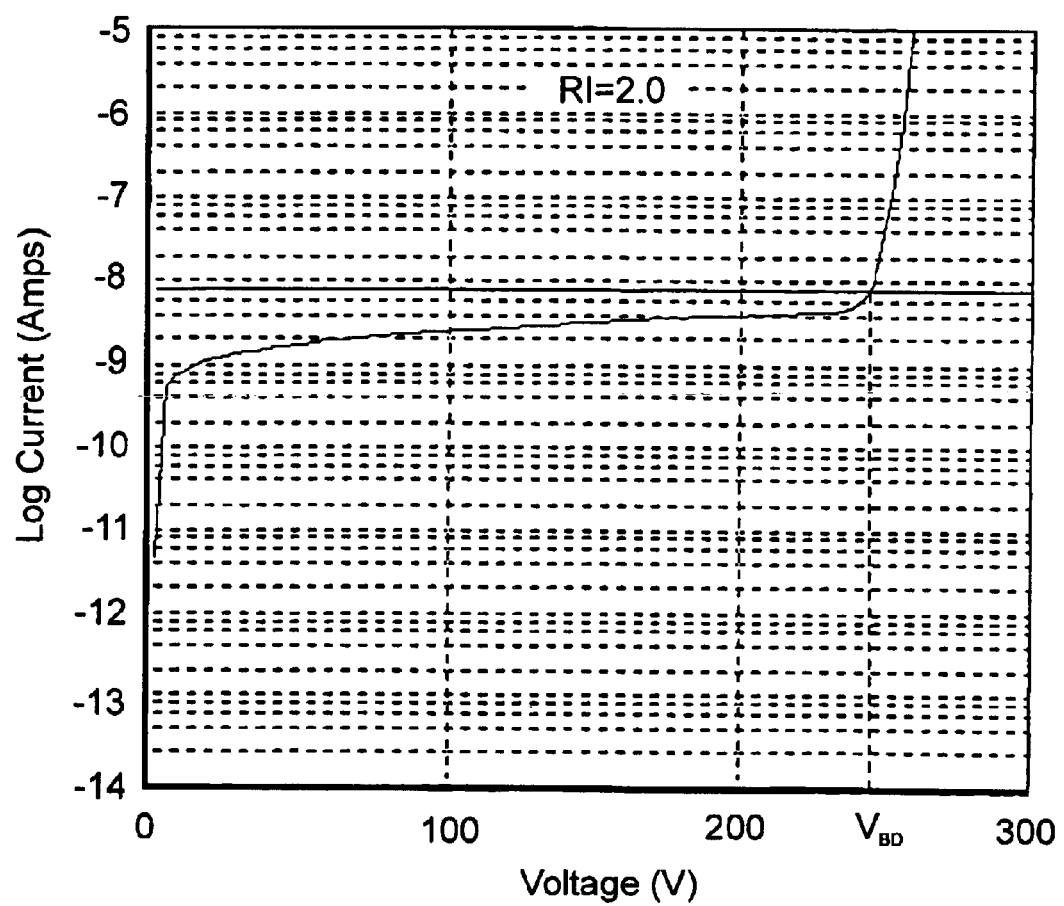
FIG. 7E is an exemplary current-voltage profile used for determining the breakdown electric field for a layer deposited in accordance with embodiments of the invention.

The electrical characteristics of a SiC-based layer deposited with a small bias may be further understood from FIG. 7E, which shows a current-voltage profile for a SiC-based layer deposited in accordance with the invention to have a refractive index of 2.0. The measured layer had a thickness of 1158 Å and the measurements were performed with a mercury probe over a probe area having a diameter of 2.199 mm. The breakdown voltage $V_{BD}$ is determined by examining the current-voltage profile and is shown on the figure. For layers having a refractive index of 2.0, the breakdown electric field was determined to be 21 MV/cm and the leakage current density was determined to be 3.6×10$^{-8}$ A/cm$^2$ at an electric field of 1 MV/cm. Similar measurements were performed for layers with other refractive indices. Above a refractive index of about 1.95, conduction through C—C bonds is limited so that the layer is not electrically leaky.

Figure 7F:
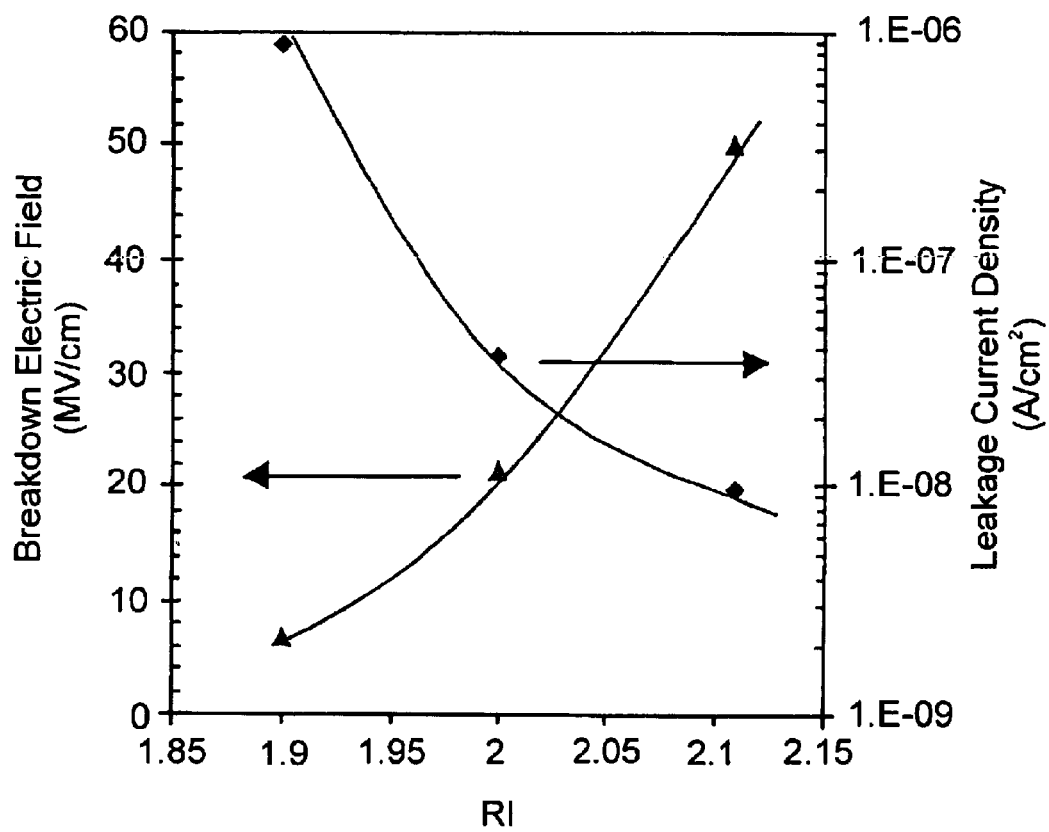
FIG. 7F is a plot of the dependence of the breakdown electric field and leakage current density as a function of refractive index for an embodiment of the invention.

The general trends for the breakdown electric field and leakage current density as a function of the refractive index are shown in FIG. 7F. The left ordinate shows the breakdown electric field and corresponds to the triangular data points, while the right ordinate shows the leakage current density and corresponds to the diamond-shaped data points. An increase in the refractive index has the effect of both increasing the breakdown electric field and reducing the leakage current density.

Various additional studies have been performed to evaluate the materials properties of a SiC-based layer deposited as described above, including testing its adhesion to layers formed with various other materials. A summary of the properties of a layer deposited with the recipe of Table I is set forth in Table II.

TABLE II

Summary of Layer Properties

| | Parameter | | Performance |
|---|---|---|---|
| M at | Film Structure [TEM] | | Amorphous |
| | Dielectric Constant [Hg Probe] | | 4.4 |
| | Refractive Index | | 2.0 |
| | Uniformity [1σ, 3 mmEE for 500 Å] (%) | | <2.0 |
| | Stress (dynes/cm$^2$) | | −4.0 × 10$^9$ |
| | Post-Anneal Stress [10 min anneal at 400° C.] (dynes/cm$^2$) | | −2.0 × 10$^9$ |
| | Stress Hysteresis (dynes/cm$^2$) | | <10$^8$ |
| | Composition (at. %) | Si | 13 |
| | | C | 46 |
| | | H | 40.5 |
| | | Ar | 0.5 |
| | Hardness at 2 μm (GPa) | | 9 |
| | Elastic Modulus at 2 μm (GPa) | | 71 |
| | Leakage Current Density [at 1 MV] (A/cm$^2$) | | 3.6 × 10$^{-8}$ |
| | Post-ashing Leakage Current Density [Ashing performed 90 days after deposition] (A/cm$^2$) | | 3.9 × 10$^{-8}$ |
| | Breakdown Electric Field (MV/cm) | | 21 |
| | Film Density (g/cm$^3$) | | 1.73 |
| | Film Roughness [AFM] | SiC/Si | 0.2 nm RMS |
| | | SiC/Cu (CMP) | 3.0 nm RMS |
| | Film Stability | Thickness | No change |
| | [90-day period] | Refractive Index | No change |
| | | Stress | No change |
| | | Dielectric Constant | <0.03 |
| | Film Change after Anneal [2 hours at 400° C.] | Layer shrinkage (%) | <0.2 |
| | | Refractive Index | <0.01 |
| | | Dielectric Constant | <0.03 |
| Adhesion Tests | Stud Pull Test (kpsi) | | >10 |
| | SiC/TaN [2 hours at 445° C.] | | Pass |
| | TaN/SiC [2 hours at 445° C.] | | Pass |
| | FSG/SiC [2 hours at 425° C.] | | Pass |
| | SiC/FSG [2 hours at 425° C.] | | Pass |
| | SiC/HBD [2 hours at 425° C.] | | Pass |
| | HBD/SiC [2 hours at 425° C.] | | Pass |
| | SiC/Cu [6 cycles of 30 minutes at 445° C.] | | Pass |

Having fully described several embodiments of the present invention, many other equivalent or alternative methods of depositing the low dielectric constant oxide layer according to the present invention will be apparent to those skilled in the art. These alternatives and equivalents are intended to be included within the scope of the present invention.

What is claimed is:

1. A method for depositing a layer over a substrate disposed in a process chamber, the substrate having an electrical resistivity between about 1 and 100 Ωcm, the method comprising:

flowing a gaseous mixture comprising a silicon-containing gas and a hydrocarbon-containing gas to the process chamber;

generating a plasma from the gaseous mixture, the plasma having an ion density greater than about $10^{11}$ ions/cm$^3$; and applying an electrical bias to the substrate, the electrical bias having a power density between about 0.65 and 1.30 W/cm$^2$.

2. The method recited in claim 1 wherein a ratio of a flow rate of the hydrocarbon-containing gas to a flow rate of the silicon-containing gas is less than 30 and greater than 10.

3. The method recited in claim 2 wherein the flow rate of the hydrocarbon-containing gas is between 150 and 300 sccm.

4. The method recited in claim 1 wherein the hydrocarbon-containing gas comprises an alkane.

5. The method recited in claim 4 wherein the alkane is selected from the group consisting of methane $CH_4$, ethane $C_2H_6$, butane $C_3H_3$, propane $C_4H_{10}$, pentane $C_5H_{12}$, and hexane $C_6H_{14}$.

6. The method recited in claim 1 wherein the silicon-containing gas comprises a silane.

7. The method recited in claim 6 wherein the silane is selected from the group consisting of monosilane $SiH_4$, disilane $Si_2H_6$, trisilane $Si_3H_8$, tetrasilane $Si_4H_{10}$, pentasilane $Si_5H_{12}$, and hexasilane $Si_6H_{14}$.

8. The method recited in claim 1 wherein the gaseous mixture further comprises an inert gas.

9. The method recited in claim 1 wherein the gaseous mixture consists essentially of an alkane, a silane, and an inert gas.

10. The method recited in claim 1 wherein the layer has an atomic carbon:silicon ratio less than about 7:1.

11. The method recited in claim 1 wherein the layer is part of an intermetal dielectric layer in a damascene structure.

12. The method recited in claim 1 wherein the layer is part of a printer-head structure.

13. The method recited in claim 1 wherein the layer has an electrical breakdown field greater than about 20 MV/cm and a leakage current density less than about 10–7 A/cm$^2$.

14. The method recited in claim 13 wherein the layer forms part of a fuse in a programmable logic device.

15. A computer-readable storage medium having a computer-readable program embodied therein for directing operation of a substrate processing system including a process chamber; a plasma generation system; a substrate holder; a gas delivery system configured to introduce gases into the process chamber, the computer-readable program including instructions for operating the substrate processing system to form a layer on a substrate disposed in the processing chamber, the substrate having an electrical resistivity between about 1 and 100 Ωcm, in accordance with the following:

flowing a gaseous mixture comprising a silicon-containing gas and a hydrocarbon-containing gas to the process chamber;

generating a plasma from the gaseous mixture, the plasma having an ion density greater than about $10^{11}$ ions/cm$^3$; and applying an electrical bias to the substrate, the electrical bias having a power density between about 0.65 and 1.30 W/cm$^2$.

16. The computer-readable storage medium recited in claim 15 wherein a flow rate of the hydrocarbon-containing gas to a flow rate of the silicon-containing gas is less than 30 and greater than 10.

17. A substrate processing system comprising:

a housing defining a process chamber;

a plasma-generating system coupled to the process chamber;

a substrate holder, configured to hold a substrate during substrate processing;

a bias generator coupled to the substrate holder;

a gas-delivery system configured to introduce gases into the process chamber;

a controller for controlling the gas delivery system and the plasma generating system; and a memory coupled to the controller comprising a computer-readable medium having a computer-readable program embodied therein for directing operation of the substrate processing system, the computer-readable program including:

instructions directing the gas delivery system to flow a gaseous mixture comprising a silicon-containing gas and a hydrocarbon-containing gas to the process chamber;

instructions directing the plasma-generating system to generate a plasma from the gaseous mixture, the plasma having an ion density greater than about $10^{11}$ ions/cm$^3$; and instructions directing the bias generator to apply an electrical bias to the substrate, the electrical bias having a power density between about 0.65 and 1.30 W/cm$^2$.

18. The substrate processing system recited in claim 17 wherein a flow rate of the hydrocarbon-containing gas to a flow rate of the silicon-containing gas is less than 30 and greater than 10.

* * * * *